(12) United States Patent
Noguchi et al.

(10) Patent No.: US 9,752,255 B2
(45) Date of Patent: Sep. 5, 2017

(54) BASE MATERIAL ON WHICH SINGLE-CRYSTAL DIAMOND IS GROWN COMPRISED OF A BASE SUBSTRATE, BONDED SINGLE-CRYSTAL MGO LAYER, AND HETEROEPITAXIAL FILM, AND METHOD FOR MANUFACTURING A SINGLE-CRYSTAL DIAMOND SUBSTRATE ON THE BASE MATERIAL

(75) Inventors: Hitoshi Noguchi, Annaka (JP); Shozo Shirai, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 1137 days.

(21) Appl. No.: 13/159,074

(22) Filed: Jun. 13, 2011

(65) Prior Publication Data
US 2011/0315074 A1 Dec. 29, 2011

(30) Foreign Application Priority Data

Jun. 28, 2010 (JP) ................................. 2010-145739
Jul. 20, 2010 (JP) ................................. 2010-162688
Nov. 26, 2010 (JP) ................................. 2010-264261

(51) Int. Cl.
*C30B 25/18* (2006.01)
*C30B 29/04* (2006.01)

(52) U.S. Cl.
CPC ............ *C30B 29/04* (2013.01); *C30B 25/183* (2013.01); *Y10T 428/263* (2015.01); *Y10T 428/266* (2015.01); *Y10T 428/30* (2015.01)

(58) Field of Classification Search
CPC ......... C30B 25/00; C30B 25/02; C30B 25/06; C30B 25/18; C30B 25/183; C30B 29/00;
(Continued)

(56) References Cited

U.S. PATENT DOCUMENTS 4,396,458 A 8/1983 Platter et al.
5,114,745 A * 5/1992 Jones ..................... C23C 16/01
117/88
(Continued)

FOREIGN PATENT DOCUMENTS

CN 1478295 A 2/2004
CN 101054720 A 10/2007
(Continued)

OTHER PUBLICATIONS

Gsell, et al. publication entitled "A route to diamond wafers by epitaxial deposition on silicon via iridium/yttria-stabilized zirconia buffer layers," Applied Physics Letters, vol. 84, pp. 4541-4543 (2004).*
(Continued)

*Primary Examiner* — Kenneth A Bratland, Jr.
(74) *Attorney, Agent, or Firm* — Oliff PLC

(57) ABSTRACT

A single-crystal diamond growth base material on which single-crystal diamond is grown having at least a base substrate of a material having a linear expansion coefficient smaller than that of MgO and not smaller than $0.5 \times 10^{-6}$/K; a single-crystal MgO layer formed on a face of the base substrate where the single-crystal diamond is grown by a bonding method; and a film constituted of any one of an iridium film, a rhodium film, and a platinum film heteroepitaxially grown on the single-crystal MgO layer.

23 Claims, 2 Drawing Sheets

(58) Field of Classification Search
CPC ..... C30B 29/02; C30B 29/04; Y10T 428/263;
Y10T 428/266; Y10T 428/30
USPC .... 117/84, 88–90, 94–95, 97, 101, 103–106,
117/108, 902, 915, 928–929
See application file for complete search history.

(56) References Cited

U.S. PATENT DOCUMENTS

| | | | |
|---|---|---|---|
| 5,861,135 | A | 1/1999 | Tanabe et al. |
| 7,033,521 | B2 | 4/2006 | Iwashita et al. |
| 7,309,515 | B2 | 12/2007 | Tsai et al. |
| 7,514,146 | B2 * | 4/2009 | Noguchi ............... C30B 25/105 204/192.1 |
| 2004/0029359 | A1 * | 2/2004 | Letertre ................. C30B 25/02 438/458 |
| 2005/0155543 | A1 | 7/2005 | Meguro et al. |
| 2005/0181210 | A1 | 8/2005 | Doering et al. |
| 2005/0220162 | A1 | 10/2005 | Nakamura |
| 2006/0112874 | A1 | 6/2006 | Yokota et al. |
| 2006/0203346 | A1 | 9/2006 | Noguchi et al. |
| 2006/0220514 | A1 | 10/2006 | Tatsumi et al. |
| 2006/0228479 | A1 | 10/2006 | Dahl et al. |
| 2007/0209578 | A1 | 9/2007 | Noguchi |
| 2009/0176114 | A1 | 7/2009 | Sawabe et al. |
| 2009/0221131 | A1 * | 9/2009 | Kubota .................. C30B 19/12 438/478 |
| 2009/0308305 | A1 | 12/2009 | Mokuno et al. |
| 2011/0081531 | A1 | 4/2011 | Noguchi |
| 2011/0084285 | A1 | 4/2011 | Noguchi |

FOREIGN PATENT DOCUMENTS

| | | |
|---|---|---|
| CN | 101521155 A | 9/2009 |
| JP | A-2-289493 | 11/1990 |
| JP | A-06-289145 | 10/1994 |
| JP | A-07-172989 | 7/1995 |
| JP | A-07-243044 | 9/1995 |
| JP | A-09-208387 | 8/1997 |
| JP | A-2002-231996 | 8/2002 |
| JP | 2005219962 A * | 8/2005 |
| JP | A-2005-219962 | 8/2005 |
| JP | A-2006-248883 | 9/2006 |
| JP | 2007238377 A * | 9/2007 |
| JP | A-2007-238377 | 9/2007 |
| JP | A-2007-284285 | 11/2007 |
| JP | A-2008-031503 | 2/2008 |
| JP | 2009-231816 A | 10/2009 |
| KR | 2007-0092098 A | 9/2007 |

OTHER PUBLICATIONS

Ohtsuka et al.; "Epitaxial Growth of Diamond on Iridium," *Jpn. J. Appl. Phys.*; Aug. 15, 1996; pp. 1072-1074; vol. 35, No. 8B.
Apr. 23, 2013 Final Notification of Reasons for Refusal issued in Japanese Application No. 2009-235992 with partial English-language translation.
Apr. 3, 2013 Decision to Dismiss an Amendment issued in Japanese Application No. 2009-230776 with partial English-language translation.
Apr. 16, 2013 Notification of Reasons for Refusal issued in Japan Application No. 2010-264261 with partial English-language translation.
Li et al., "Epitaxial Growth of an MgO Buffer Layer and Electrode Layer on Si for Pb(Zr,Ti)O$_3$ by PLD," IEEE, pp. 909-912, 2001.
Feb. 7, 2013 Office Action issued in U.S. Appl. No. 12/884,926.
Feb. 5, 2013 Notification of Reasons for Refusal issued in Japanese Application No. 2009-235992 with partial English-language translation.
Bauer et al., "Growth of Epitaxial Diamond on Silicon via Iridium/SrTiO$_3$ Buffer Layers," Diamond & Related Materials, vol. 14, pp. 314-317, 2005.
Gsell et al., "A Route to Diamond Wafers by Epitaxial Deposition on Silicon via Iridium/Yttria-Stabilized Zirconia Buffer Layers," Applied Physics Letters, vol. 84, No. 22, pp. 4541-4543, May 31, 2004.
Jul. 31, 2012 Notification of Reasons for Refusal issued in Japanese Application No. 2009-230776 with partial English-language translation.
Jul. 31, 2012 Notification of Reasons for Refusal issued in Japanese Application No. 2009-235992 with partial English-language translation.
Aug. 30, 2012 Chinese Office Action issued in Chinese Application No. 201010226110.1 with partial English-language translation.
Aug. 30, 2012 Chinese Office Action issued in Chinese Application No. 201010226112.0 with partial English-language translation.
Oct. 23, 2012 Notification of Reasons for Refusal issued in Japanese Application No. 2009-230776 with partial English-language translation.
Nov. 13, 2012 Notification of Reasons for Refusal issued in Japanese Application No. 2009-235992 with partial English-language translation.
Jan. 8, 2013 Notification of Reasons for Refusal issued in Japanese Application No. 2009-230776 with partial English-language translation.
Jun. 22, 2012 Office Action issued in U.S. Appl. No. 12/876,531.
Jan. 18, 2013 Office Action issued in U.S. Appl. No. 12/876,531.
Mokuno et al.; "High-rate growth of single crystalline diamond using microwave plasma CVD (IV);" *NDF-Dai. Stmp.*; Nov. 21, 2006; pp. 6-7.
Aug. 16, 2013 Office Action issued in U.S. Appl. No. 13/888,187.
Sep. 3, 2013 Notification of Reasons for Refusal issued in Japanese Application No. 2010-264261 with partial English-language translation.
Sep. 26, 2013 Taiwanese Office Action issued in Taiwanese Application No. 100122464 with partial English-language translation.
Jul. 23, 2013 Chinese Office Action issued in Chinese Application No. 201110177039.7 with partial English-language translation.
Jan. 10, 2014 Office Action issued in U.S. Appl. No. 13/888,187.
Jul. 7, 2014 Office Action issued in Chinese Application No. 201110177039.7 (with partial English translation).
Jan. 8, 2015 Office Action issued in U.S. Appl. No. 13/888,187.
Jul. 18, 2016 Office Action issued in Korean Application No. 2011-0056955.
Apr. 20, 2017 Office Action issued in Korean Patent Application No. 10-2017-0020604.
Jan. 14, 2017 Office Action issued in Korean Patent Application No. 2011-0056955.
Sep. 4, 2015 Office Action issued in U.S. Appl. No. 13/846,540.
May 13, 2015 Office Action issued in U.S. Appl. No. 13/888,187.

* cited by examiner

BASE MATERIAL ON WHICH SINGLE-CRYSTAL DIAMOND IS GROWN COMPRISED OF A BASE SUBSTRATE, BONDED SINGLE-CRYSTAL MGO LAYER, AND HETEROEPITAXIAL FILM, AND METHOD FOR MANUFACTURING A SINGLE-CRYSTAL DIAMOND SUBSTRATE ON THE BASE MATERIAL

BACKGROUND OF THE INVENTION

1. Field of the Invention

The present invention relates to a single-crystal diamond growth base material and a method for manufacturing a single-crystal diamond substrate.

2. Description of the Related Art

Diamond has a wide band gap of 5.47 eV and also has a very high dielectric breakdown electric field intensity of 10 MV/cm. Further, since it has thermal conductivity that is the highest value among materials, using the diamond is advantageous for a high-output power device.

Furthermore, the diamond has high drift mobility and, even if its Johnson performance index is compared, the diamond is most advantageous as a high-speed power device among semiconductors.

Therefore, it is said that the diamond is an ultimate semiconductor suitable for a high-frequency/high-output electronic device. Accordingly, studies on various kinds of electronic devices utilizing single-crystal diamond as a substrate have been advanced.

At present, in many cases, the single-crystal diamond for fabrication of a diamond semiconductor is diamond called an Ib type synthesized by a high-temperature and high-pressure method (HPHT) or an IIa type having improved purity.

However, the HPHT single-crystal diamond having high crystallinity can be obtained but, on the other hand, increasing its size is difficult, and a price extremely rises as the size increases, whereby practical realization as a device substrate is difficult.

Thus, to provide an inexpensive single-crystal diamond substrate having a large area, CVD single-crystal diamond synthesized by a vapor phase method has been also studied.

In recent years, as single-crystal diamond, homoepitaxial CVD single-crystal diamond homoepitaxially grown directly on an HPHT single-crystal diamond base material (a seed base material) by a vapor-phase synthesis method has been also reported (see the 20th diamond symposium lecture summary (2006), pp. 6-7.).

According to this method, since the base material and the grown single-crystal diamond are formed of the same material, they are hardly separated from each other, and hence there are problems in cost, e.g., requiring ion implantation into the base material in advance or requiring a prolonged wet etching separation treatment even after the growth. Further, the crystallinity of the obtained single-crystal diamond is lowered to some extent since ions are implanted into the base material.

As another method, CVD single-crystal diamond heteroepitaxially grown by a CVD method on an single-crystal iridium (Ir) film heteroepitaxially grown on a single-crystal MgO base material (a seed base material) has been also reported (see Jpn. J. Appl. Phys. Vol. 35 (1996) pp. L1072-L1074).

However, this method has a problem that the base material and the grown single-crystal diamond are broken into pieces due to stress (a sum of internal stress and thermal stress) generated between the single-crystal MgO substrate and the single-crystal diamond grown via the single-crystal Ir film.

SUMMARY OF THE INVENTION

In view of the above-described problem, it is an object of the present invention to provide a single-crystal diamond growth base material and a method for manufacturing a single-crystal diamond substrate that enable growing single-crystal diamond having a large area and excellent crystallinity and inexpensively manufacturing the high-quality single-crystal diamond substrate.

To achieve this object, according to the present invention, there is provided a single-crystal diamond growth base material on which single-crystal diamond is grown, comprising at least: a base substrate consisting of a material having a linear expansion coefficient smaller than that of MgO and not smaller than $0.5 \times 10^{-6}$/K; a single-crystal MgO layer formed on a face of the base substrate where the single-crystal diamond is grown by a bonding method; and a film constituted of any one of an iridium film, a rhodium film, and a platinum film heteroepitaxially grown on the single-crystal MgO layer.

As described above, the iridium film, the rhodium film, or the platinum film can be grown with excellent crystallinity on the single-crystal MgO layer having high crystallinity obtained by bonding the base substrate surface consisting of the material having the linear expansion coefficient smaller than that of MgO and not smaller than $0.5 \times 10^{-6}$/K to the single-crystal MgO having the smoothed and polished surface, and growing the single-crystal diamond on this base material enables obtaining the single-crystal diamond having the high crystallinity.

Furthermore, when the base substrate consisting of the material having the linear expansion coefficient smaller than that of MgO and not smaller than $0.5 \times 10^{-6}$/K is adopted, the thermal expansion coefficient is relatively close to that of the diamond, and stress produced due to thermal expansion at the time of growth of the single-crystal diamond can be reduced, and the single-crystal diamond or the base material is hardly broken. Moreover, when the MgO layer and the film constituted of any one of the iridium film, the rhodium film, and the platinum film are provided on such a base substrate, they can function as an excellent buffer layer at the time of growth of the single-crystal diamond.

Additionally, since the MgO layer is formed by bonding the single-crystal MgO substrate to the base substrate, the single-crystal MgO layer having the high crystallinity can be easily formed as compared with heteroepitaxial growth of the MgO layer, thereby enabling manufacture with high productivity.

As described above, the single-crystal diamond growth base material according to the present invention can serve as the base material that enables growing the single-crystal diamond having a large area and high crystallinity at a low cost.

Here, the base substrate can consist of any one of $Al_2O_3$, SiC, AlN, Si, $Si_3N_4$, diamond, and $SiO_2$.

The base substrate consisting of any one of $Al_2O_3$, SiC, AlN, Si, $Si_3N_4$, and $SiO_2$ is inexpensive, and the smooth polished surface can be obtained. Further, since the base substrate consisting of diamond (HPHT, polycrystal) is the same material as the diamond to be grown, stress due to thermal expansion is hardly generated, and the base material that enables obtaining the single-crystal diamond having a large area can be provided.

At this time, it is preferable for a thickness of the base substrate to be 0.03 to 20.00 mm.

When the base substrate having such a thickness is used, handling is easy. Furthermore, if the thickness is not greater than 20.00 mm, double-side polishing and others can be excellently carried out.

At this time, it is preferable for a thickness of the single-crystal MgO layer to be 0.1 to 100 μm.

As described above, the film thickness uniformity is high in terms of the processing technology when the thickness of the single-crystal MgO layer is 0.1 μm or above, and stress generated between this layer and the substrate or the single-crystal diamond is small when the thickness is 100 μm or below, thereby assuredly growing the single-crystal diamond.

At this time, any one of the iridium film, the rhodium film, and the platinum film can be heteroepitaxially grown on the single-crystal MgO layer by a sputtering method.

As described above, the iridium film, the rhodium film, or the platinum film of the base material according to the present invention can be obtained by heteroepitaxial growth based on the sputtering method.

At this time, it is preferable for a thickness of any one of the iridium film, the rhodium film, and the platinum film to be 5 Å(angstrom) to 100 μm.

As described above, when any one of the iridium film, the rhodium film, and the platinum film has the thickness of 5 Å or above, the film thickness uniformity and the crystallinity can be sufficiently enhanced. Further, when the thickness is 100 μm or below, stress generated between the film and the substrate or the single-crystal diamond is small, whereby the single-crystal diamond can be assuredly grown and the inexpensive base material can be obtained.

At this time, it is preferable that a surface of any one of the iridium film, the rhodium film, and the platinum film is subjected to a bias treatment.

As described above, if the bias treatment is carried out, since diamond growth nucleuses can be formed on the surface, the single-crystal diamond can be grown with good crystallinity at a sufficient growth rate.

Furthermore, according to the present invention, there is provided a method for manufacturing a single-crystal diamond substrate, comprising at least: a step of preparing a base substrate that consists of a material having a linear expansion coefficient smaller than that of MgO and not smaller than $0.5 \times 10^{-6}$/K; a step of bonding a single-crystal MgO layer to the prepared base substrate; a step of heteroepitaxially growing a film constituted of any one of an iridium film, a rhodium film, and a platinum film on the bonded single-crystal MgO layer; a step of heteroepitaxially growing single-crystal diamond on the heteroepitaxially grown film; and a step of separating the heteroepitaxially grown single-crystal diamond to obtain a single-crystal diamond substrate.

As described above, the iridium film, the rhodium film, or the platinum film can be grown with excellent crystallinity on the single-crystal MgO layer having high crystallinity formed on the base substrate consisting of the material having the linear expansion coefficient smaller than that of MgO and not smaller than $0.5 \times 10^{-6}$/K based on the bonding method, and the single-crystal diamond having the high crystallinity can be grown on the iridium film, the rhodium film, or the platinum film having the excellent crystallinity. Moreover, when the base substrate consisting of the material having the linear expansion coefficient smaller than that of MgO and not smaller than $0.5 \times 10^{-6}$/K is adopted, stress generated due to thermal expansion at the time of growth of the single-crystal diamond is small, both the base substrate and the single-crystal diamond are hardly broken.

As described above, according to the manufacturing method of the present invention, the inexpensive single-crystal diamond substrate having the high crystallinity can be efficiently manufactured.

Here, a substrate consisting of any one of $Al_2O_3$, SiC, AlN, Si, $Si_3N_4$, diamond, and $SiO_2$ can be prepared as the base substrate to be prepared.

When the base material consisting of any one of $Al_2O_3$, SiC, AlN, Si, and $Si_3N_4$, and $SiO_2$ is prepared as the base substrate, the substrate itself is inexpensive, and the smooth polished surface can be obtained. Additionally, the base substrate consisting of the diamond (HPHT, polycrystal) is the same material as the diamond to be grown, stress due to thermal expansion is hardly generated, and the base material is particularly suitable for obtaining the single-crystal diamond having a large area.

At this time, it is preferable that a bias treatment is carried out with respect to a surface on which the single-crystal diamond is heteroepitaxially grown before the step of heteroepitaxially growing the single-crystal diamond.

As described above, when the bias treatment is carried out in advance, since diamond growth nucleuses can be formed on the surface, the single-crystal diamond can be grown with good crystallinity at a sufficient growth rate.

At this time, the single-crystal diamond can be heteroepitaxially grown by a microwave CVD method or a direct-current plasma CVD method at the step of heteroepitaxially growing the single-crystal diamond.

As described above, in the manufacturing method according to the present invention, the single-crystal diamond can be heteroepitaxially grown by the microwave CVD method or the direct-current plasma CVD method.

As described above, according to the single-crystal diamond growth base material and the method for manufacturing a single-crystal diamond substrate of the present invention, single-crystal diamond having a large area and high crystallinity can be grown at a low cost, and a high-quality single-crystal diamond substrate can be also manufactured with good productivity.

DETAILED DESCRIPTION OF THE PREFERRED EMBODIMENT

In conventional examples, when acquisition of single-crystal diamond by a CVD method that is advantageous in terms of cost is tried, there occur problems that a grown single-crystal diamond portion cannot be easily separated without damage and that growing the single-crystal diamond having high crystallinity and a large area is difficult.

Therefore, the present inventors repeatedly and keenly conducted studies about types or configurations of base materials and a method for manufacturing single crystal.

As a result, the present inventors discovered that stress produced due to thermal expansion is reduced to be lower than that in a conventional MgO seed base material by using a base substrate consisting of a material having the linear expansion coefficient smaller than that of MgO and not smaller than $0.5 \times 10^{-6}$/K, which has a relatively small difference in linear expansion coefficient from that of diamond, as a main constituent base material that mainly produces stress between itself and a single-crystal diamond layer, whereby overall breaking can be avoided (in regard to the linear expansion coefficient, see the following Table 1).

TABLE 1

| MATERIAL | LINEAR EXPANSION COEFFICIENT ($\times 10^{-6}$/K) |
|---|---|
| DIAMOND | 1.1 |
| Ir | 7.1 |
| MgO | 13.8 |
| $Al_2O_3$ | 6.7 |
| SiC | 6.6 |
| AlN | 4.5 |
| Si | 4.2 |
| $Si_3N_4$ | 1.5 |
| $SiO_2$ | 0.5 |

Further, such a base substrate can be bonded to a single-crystal MgO substrate to obtain a single-crystal MgO layer having high crystallinity on the base substrate.

Furthermore, the single-crystal MgO layer can be used as a seed base material, and a single-crystal Ir (iridium) film, a single-crystal Rh (rhodium) film, or a single-crystal Pt (platinum) film can be heteroepitaxially grown with excellent crystallinity on this layer. Moreover, the present inventors discovered that, when this material having high crystallinity is used as a base material to heteroepitaxially grow the single-crystal diamond thereon by the CVD method, the single-crystal diamond having high crystallinity can be obtained.

Additionally, they confirmed that the single-crystal diamond grown on this base material can be easily separated by a wet etching method or can be separated by removing the base material portion by a mechanical polishing method, thereby bringing the present invention to completion.

Although an example of embodiments of the present invention will now be described hereinafter in detail with reference to the drawings, the present invention is not restricted thereto.

Figure 1:
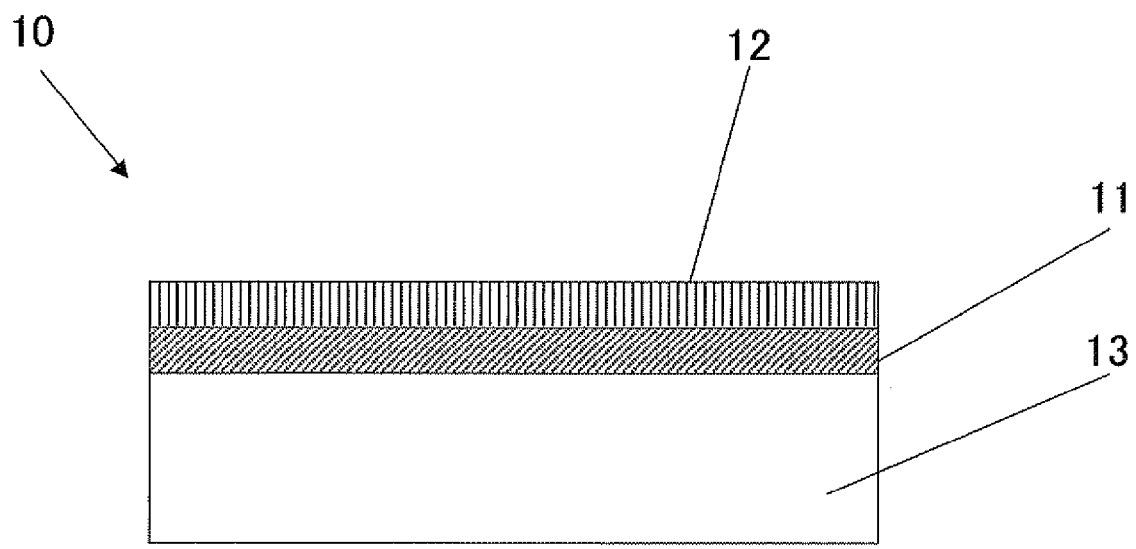
FIG. 1 is a schematic view showing an example of embodiments of a single-crystal diamond growth base material according to the present invention.

FIG. 1 is a schematic view showing an example of embodiments of a single-crystal diamond growth base material according to the present invention.

A single-crystal diamond growth base material 10 of the present invention depicted in FIG. 1 is comprised of a base substrate 13 that consists of a material having a linear expansion coefficient smaller than that of MgO and not smaller than $0.5 \times 10^{-6}$/K, a single-crystal MgO layer 11 formed by a bonding method on a face of the base substrate 13 where single-crystal diamond is grown, and a film 12 formed of any one of an iridium film, a rhodium film, and a platinum film heteroepitaxially grown on the single-crystal MgO layer 11.

As described above, if the main constituent base material is the base substrate consisting of the material having the linear expansion coefficient smaller than that of MgO and not smaller than $0.5 \times 10^{-6}$/K, such a substrate is mass-produced for semiconductor devices, thereby obtaining an inexpensive substrate having excellent crystallinity. Furthermore, since the single-crystal MgO layer having high crystallinity formed on the base substrate by the bonding method is used as a seed base material, crystallinity of the iridium film, the rhodium film, or the platinum film formed on a surface of this MgO layer with good crystallinity can be also improved, and growing single-crystal diamond on this base material enables obtaining the single-crystal diamond having high crystallinity.

Moreover, when the main constituent base material is the base substrate consisting of the material having the linear expansion coefficient smaller than that of MgO and not smaller than $0.5 \times 10^{-6}$/K, a thermal expansion coefficient is relatively close to that of diamond as compared with a case where the single-crystal MgO base substrate is used as the base substrate, and hence the single-crystal diamond or the base material itself is hardly broken due to stress caused by thermal expansion.

Additionally, since the single-crystal MgO layer and any one of the iridium film, the rhodium film, and the platinum film are provided on the base substrate, a function as an excellent buffer layer can be exercised at the time of single-crystal diamond growth. That is, although the single-crystal MgO has the linear expansion coefficient greatly different from that of the diamond as described above, since the layer conformation is provided in the present invention, stress can be absorbed, and hence there occurs no problem in growth of the diamond. Instead, at the time of separation after the diamond growth, there is an advantage that presence of the MgO layer facilitates delamination of the single-crystal diamond film.

Figure 2:
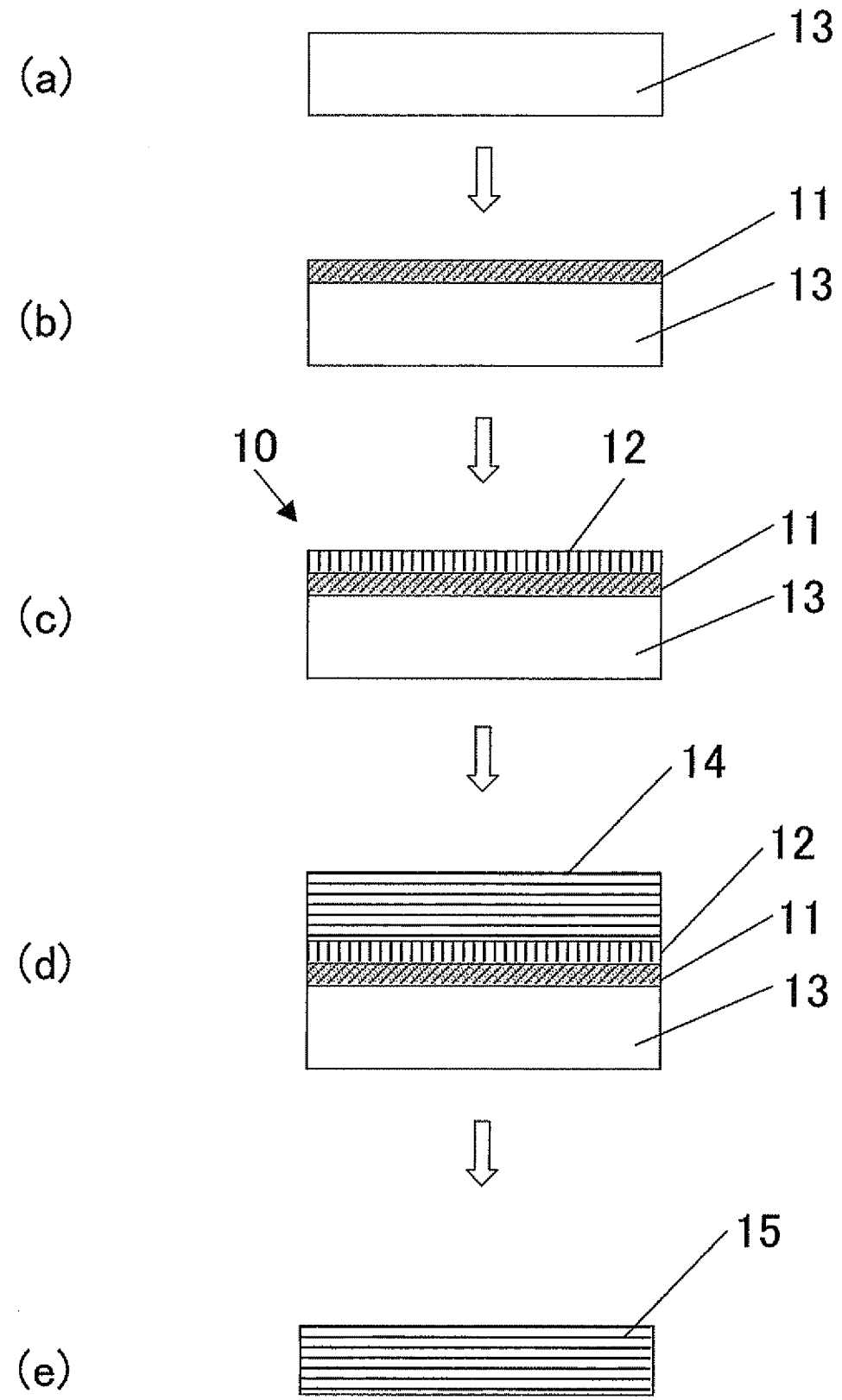
FIG. 2 is a flowchart showing an example of embodiments of a method for manufacturing a single-crystal diamond substrate according to the present invention.

An example of a method for fabricating a single-crystal diamond growth base material as described above and a method for manufacturing a single-crystal diamond substrate according to the present invention will now be explained hereinafter with reference to FIG. 2. FIG. 2 is a flowchart showing an example of embodiments of the method for manufacturing a single-crystal diamond substrate according to the present invention.

As shown in FIG. 2(a), the base substrate 13 consisting of a material having the linear expansion coefficient smaller than that of MgO and not smaller than $0.5 \times 10^{-6}$/K is first prepared.

Here, the base substrate 13 may consist of any one of $Al_2O_3$, SiC, AlN, Si, $Si_3N_4$, diamond, and $SiO_2$.

When the material consisting of one of $Al_2O_3$, SiC, AlN, Si, $Si_3N_4$, and $SiO_2$ is used as the base substrate, such a material is inexpensive since it can be easily prepared. In addition, highly accurate polishing can be performed, and thus a smooth polished surface, i.e., a flat bonding surface can be obtained. Here, in case of $Al_2O_3$, SiC, AlN, Si, or $Si_3N_4$, producing a sintered body as the substrate is preferable. Since the base substrate consisting of diamond (HPHT, polycrystal) is the same material as diamond to be grown, stress due to thermal expansion between the base material and the grown diamond is hardly generated, and single-crystal diamond having a large area can be more efficiently manufactured.

Furthermore, a thickness of this base substrate 13 can be set to 0.03 to 20.00 mm.

When the thickness of the base material is 0.03 mm or above, handling is easy. When the thickness is 20.00 mm or below, the thickness is not too large beyond necessity and is favorable in terms of a cost, and a finish double-side polishing treatment and others can be readily performed, whereby a good surface state can be obtained and bonding at a later step can be excellently carried out.

Then, as shown in FIG. 2(b), the base substrate surface is bonded to the single-crystal MgO substrate finished into a smooth bonding surface like the base substrate surface, thereby forming the single-crystal MgO layer 11.

It is effective to carry out this bonding after cleaning and activating both bonding surfaces based on, e.g., a plasma treatment or wet etching.

Further, to improve a yield ratio of this bonding process, this process can be carried out by bonding through a layer obtained by forming a thin film of a metal such as gold (Au), platinum (Pt), titanium (Ti), chromium (Cr), iridium (Ir), or rhodium (Rh), or silicon (Si) or a silicon oxide ($SiO_2$), or a laminated film formed of these films with a thickness of 0.001 to 1000 μm on a bonding interface.

Furthermore, as the MgO substrate to be bonded, for example, a single-crystal MgO substrate that has been subjected to double-side polishing and has a diameter of 25 mm and a thickness of 300 μcan be prepared.

Moreover, the single-crystal MgO substrate to be bonded usually has a thickness of approximately 200 μm to 1000 μm, but processing the substrate to reduce the thickness thereof is desirable in order to reduce stress after growth of the single-crystal diamond.

For example, ions of hydrogen, oxygen, carbon or the like may be implanted into the MgO layer at a position to which the thickness is to be reduced, bonding may be carried out, then separation is effected by heating as required, and thickness adjustment and smooth surface finish may be performed by a polishing treatment. Otherwise thickness adjustment and smooth surface finish may be performed by a polishing treatment alone after bonding.

Moreover, the thickness of the single-crystal MgO layer after bonding can be set to 0.1 to 100 μm.

As described above, if the single-crystal MgO layer has the thickness of 0.1 μm or above, a thinning treatment can be performed with high film thickness uniformity. If the thickness is 100 μm or below, since stress generated between the layer and the substrate or the single-crystal diamond is small, the single-crystal diamond can be more assuredly grown, which is advantageous in terms of cost to realize inexpensive production.

Then, as shown in FIG. 2(c), the film 12 constituted of any one of an iridium film, a rhodium film, and a platinum film is heteroepitaxially grown on the single-crystal MgO layer 11 by, e.g., a sputtering method.

Although growth conditions and others in this process are not restricted in particular, growth can be effected at a sufficient rate based on, e.g., an R. F. magnetron sputtering method.

Additionally, a thickness of the film 12 constituted of any one of the iridium film, the rhodium film, and the platinum film can be set to 5 Å to 100 μm.

The film thickness uniformity and crystallinity are high if the thickness of the film constituted of any one of the iridium film, the rhodium film, and the platinum film is 5 Å or above as described above, and stress generated between the film and the substrate or the single-crystal diamond is small if the thickness is 100 μm or below, and hence the single-crystal diamond can be more assuredly grown, thereby reducing the cost.

As described above, the single-crystal diamond growth base material 10 according to the present invention can be fabricated. Here, a bias treatment can be performed with respect to a surface of the film 12 constituted of any one of the iridium film, the rhodium film, and the platinum film in the single-crystal diamond base material 10 before the single-crystal diamond growth as a post-process.

According to this bias treatment, for example, a pre-treatment of forming diamond growth nucleuses by direct-current discharge using a base material-side electrode as a cathode is first carried out, and the diamond growth nucleuses having aligned orientations are formed on the surface of the film constituted of any one of the iridium film, the rhodium film, and the platinum film based on such a method as described in Japanese Unexamined Patent Application Publication No. 2007-238377. As a result, in the post-process, the single-crystal diamond can be grown with good crystallinity at a sufficient growth rate.

Then, as shown in FIG. 2(d), single-crystal diamond 14 is heteroepitaxially grown by, e.g., a microwave CVD method or a direct-current plasma CVD method.

As described above, according to the present invention, since the base substrate that consists of a material having a linear expansion coefficient smaller than that of MgO and not smaller than $0.5 \times 10^{-6}$/K is used as a seed base material which has the largest thickness in the base material and in which stress is apt to be generated, the stress is hardly produced even at the time of the single-crystal diamond growth, thus avoiding breaking. Furthermore, since the iridium film, the rhodium film, or the platinum film formed on the high-crystallinity single-crystal MgO layer has excellent crystallinity, the single-crystal diamond having high crystallinity can be grown.

Subsequently, as shown in FIG. 2(e), the single-crystal diamond 14 is separated to obtain a single-crystal diamond substrate 15.

A separating method is not restricted in particular, and the base material can be immersed in a wet etching solution such as phosphoric acid solution or hot mixed acid to separate the single-crystal diamond/iridium film from the MgO layer/base substrate, and then the remaining iridium film can be removed by a mechanical polishing method to obtain the single-crystal diamond substrate. Further, the iridium film/MgO layer/base substrate may be removed by the mechanical polishing method at a time without immersion in the wet etching solution.

When the single-crystal diamond growth base material and the single-crystal diamond substrate manufacturing method according to the present invention described above are adopted, the single-crystal diamond substrate with a large area and high crystallinity that can be used for device applications can be manufactured at a low cost.

EXAMPLES

The present invention will now be more specifically explained hereinafter in conjunction with examples and comparative examples, but the present invention is not restricted thereto.

Example 1

A single-crystal silicon substrate that has a diameter of 25.0 mm, a thickness of 0.38 mm, and an orientation (100) and has been subjected to double-side polishing was prepared as a base substrate. Further, a single-crystal MgO substrate that has a diameter of 25.0 mm, a thickness of 0.30 mm, and an orientation (100) and has been subjected to double-side polishing was prepared on a surface of this base substrate where single-crystal diamond growth is carried out.

Both bonding surfaces were cleaned and activated by RCA cleaning and an argon ion beam, and these substrates were bonded by direct bonding.

Then, a single-crystal MgO portion was thinned by a mechanical polishing method to be finished into a single-crystal MgO layer having a thickness of 2 μm.

Subsequently, an iridium (Ir) film was heteroepitaxially grown on this single-crystal MgO layer. As film formation, sputtering was carried out by R. F. magnetron sputtering method targeting Ir under conditions of an Ar gas of $6 \times 10^{-2}$ Torr and a substrate temperature of 700° C. until a single-crystal Ir film thickness becomes 1.5 μm.

Furthermore, to achieve electrical conduction for performing the bias treatment and the DC plasma CVD, Ir was grown 1.5 μm on a back surface under the same conditions except that a substrate temperature was set to 100° C.

Then, the bias treatment for forming nucleuses of diamond on a surface of the single-crystal Ir film of this base material was carried out.

The base material was first set on a negative voltage application electrode (a cathode) of a bias treatment apparatus, and evacuation was performed. Subsequently, the base material was heated to 600° C., a 3-vol. % hydrogen diluted methane gas was introduced to set a pressure to 160 hPa (120 Torr), and the bias treatment was conducted. That is, a DC voltage was applied to both electrodes to flow predetermined direct-current electricity.

Moreover, at last, the single-crystal diamond was heteroepitaxially grown on the bias-treated base material by a DC plasma CVD method at 900° C. for 30 hours.

After end of the growth, a product taken out from a bell jar was a laminated structure of diamond/Ir/MgO/Si with no breaking. Therefore, the Ir/MgO/Si base material portion on the back surface was removed by the mechanical polishing method to provide a self-standing structure of the single-crystal diamond (a single-crystal diamond substrate). This surface was also subjected to final polishing to obtain surface roughness that can bear with use in device applications.

The obtained single-crystal diamond substrate was evaluated by using Raman spectroscopy, XRD rocking curve, cross section TEM, and cathodoluminescence (CL), and it was confirmed that this substrate has sufficient crystallinity.

Example 2

Various processes from the beginning to the heteroepitaxial growth of single-crystal diamond were carried out by the same method as that in Example 1 except that a gold (Au) thin film of 1 nm thickness was formed by a sputtering method on bonding surfaces of both a base substrate and single-crystal MgO and then bonding was effected.

After end of the growth, a product taken out from a bell jar was a laminated structure of diamond/Ir/MgO/Au/Si with no breaking in which voids generated on the bonded surfaces were reduced to ½ or below as compared with Example 1.

Therefore, the Ir/MgO/Si base material portion on a back surface was removed by the mechanical polishing method to provide a self-standing structure of the single-crystal diamond (a single-crystal diamond substrate). This surface was also subjected to final polishing to obtain surface roughness that can bear with use in device applications.

The obtained single-crystal diamond substrate was evaluated by using Raman spectroscopy, XRD rocking curve, cross section TEM, and cathodoluminescence (CL), and it was confirmed that this substrate has sufficient crystallinity.

Example 3

To reduce a film thickness of a single-crystal MgO portion bonded to single-crystal silicon, which is a base substrate, an ion implantation and separation method was used.

After implantation of hydrogen ions into a single-crystal MgO substrate at a depth of approximately 3 μm from a surface of this substrate that is to be bonded to a silicon substrate, both bonding surfaces were cleaned and activated by RCA cleaning and argon ion beams and then bonded by direct bonding. Thereafter, a heat treatment was carried out at 400° C. for 1 hour to separate the silicon-side single-crystal MgO portion with a thickness of approximately 3 μm with a hydrogen ion implanted layer at a boundary. Further, the single-crystal MgO portion was thinned by the mechanical polishing method and finished into a single-crystal MgO layer having a thickness of 2 μm.

As subsequent processes, like Example 1, Ir growth and a bias treatment were performed to prepare a base material, and single-crystal diamond was heteroepitaxially grown on the base material by a DC plasma CVD method.

After end of the growth, a product taken out from a bell jar was a laminated structure of diamond/Ir/MgO/Si with no breaking. Therefore, the Ir/MgO/Si base material portion on the back surface was removed by the mechanical polishing method to provide a self-standing structure of the single-crystal diamond (a single-crystal diamond substrate). This surface was also subjected to final polishing to obtain surface roughness that can bear with use in device applications.

The obtained single-crystal diamond substrate was evaluated by using Raman spectroscopy, XRD rocking curve, cross section TEM, and cathodoluminescence (CL), and it was confirmed that this substrate has sufficient crystallinity.

Example 4

Various processes from the beginning to heteroepitaxial growth of single-crystal diamond were carried out by the same method as that in Example 1 except that an $SiO_2$ substrate subjected to double-side polishing was used in place of a single-crystal silicon substrate subjected to double-side polishing as the base substrate.

After end of the growth, a product taken out from a bell jar was a laminated structure of diamond/Ir/MgO/$SiO_2$ with no breaking. Therefore, the Ir/MgO/$SiO_2$ base material portion on the back surface was removed by the mechanical polishing method to provide a self-standing structure of the single-crystal diamond (a single-crystal diamond substrate). This surface was also subjected to final polishing to obtain surface roughness that can bear with use in device applications.

The obtained single-crystal diamond substrate was evaluated by using Raman spectroscopy, XRD rocking curve, cross section TEM, and cathodoluminescence (CL), and it was confirmed that this substrate has sufficient crystallinity.

Example 5

Various processes from the beginning to heteroepitaxial growth of single-crystal diamond were carried out by the same method as that in Example 1 except that an SiC substrate subjected to double-side polishing was used in place of a single-crystal silicon substrate subjected to double-side polishing as the base substrate.

After end of the growth, a product taken out from a bell jar was a laminated structure of diamond/Ir/MgO/SiC with no breaking. Therefore, the Ir/MgO/SiC base material portion on the back surface was removed by the mechanical polishing method to provide a self-standing structure of the single-crystal diamond (a single-crystal diamond substrate).

This surface was also subjected to final polishing to obtain surface roughness that can bear with use in device applications.

The obtained single-crystal diamond substrate was evaluated by using Raman spectroscopy, XRD rocking curve, cross section TEM, and cathodoluminescence (CL), and it was confirmed that this substrate has sufficient crystallinity.

Comparative Example 1

Ir growth and a bias treatment were performed to prepare a base material, and single-crystal diamond was heteroepitaxially grown on the base material by a DC plasma CVD method like Examples except that a 5.0-mm-square single-crystal MgO substrate with a thickness of 0.5 mm and an orientation (100) subjected to double-side polishing was used as a seed base material.

When a bell jar was opened to see a product in a chamber, both the base material and the single-crystal diamond portion were broken into small pieces each having a length of approximately 1 mm on each side. When one of these pieces was taken to evaluate crystallinity, the crystallinity was insufficient for device applications since Raman full width at half maximum was wide and many dislocation defects were observed in cross section TEM.

Comparative Example 2

Ir growth and a bias treatment were performed to prepare a base material, and single-crystal diamond was heteroepitaxially grown on the base material by a DC plasma CVD method like Examples except that a 5.0-mm-square single-crystal MgO substrate with a thickness of 120 μm and an orientation (100) subjected to double-side polishing was used as a seed base material.

When a bell jar was opened to see a product in a chamber, both the base material and the single-crystal diamond portion were broken into small pieces each having a length of approximately 1 mm on each side.

It is to be noted that the present invention is not restricted to the foregoing embodiment. The foregoing embodiment is just an exemplification, and any examples that have substantially the same configurations and exercise the same functions and effects as the technical concept described in claims of the present invention are included in the technical scope of the invention.

What is claimed is:

1. A single-crystal diamond growth base material on which single-crystal diamond is grown, comprising at least:
   a base substrate consisting of a material having a linear expansion coefficient smaller than that of MgO and not smaller than $0.5 \times 10^{-6}$/K;
   a single-crystal MgO layer formed on a face of the base substrate where the single-crystal diamond is grown by bonding a single-crystal MgO substrate having a thickness of 200 to 1000 μm to the base substrate and thinning the single-crystal MgO substrate by mechanical polishing; and
   a film constituted of any one of an iridium film, a rhodium film, and a platinum film heteroepitaxially grown on the single-crystal MgO layer;
   wherein bonding the single-crystal MgO substrate to the base substrate is done through a bonding layer obtained by forming on a bonding interface a film of an element or compound selected from the group consisting of gold (Au), platinum (Pt), titanium (Ti), chromium (Cr), iridium (Ir), rhodium (Rh), silicon (Si), and silicon oxide ($SiO_2$), or a laminated film formed of these films, the bonding layer having a thickness of 0.001 to 1000 μm.

2. The single-crystal diamond growth base material according to claim 1, wherein the base substrate consists of any one of $Al_2O_3$, SiC, AlN, Si, $Si_3N_4$, diamond, and $SiO_2$.

3. The single-crystal diamond growth base material according to claim 1, wherein a thickness of the base substrate is 0.03 to 20.00 mm.

4. The single-crystal diamond growth base material according to claim 2, wherein a thickness of the base substrate is 0.03 to 20.00 mm.

5. The single-crystal diamond growth base material according to claim 1, wherein a thickness of the single-crystal MgO layer is 0.1 to 100 μm.

6. The single-crystal diamond growth base material according to claim 2, wherein a thickness of the single-crystal MgO layer is 0.1 to 100 μm.

7. The single-crystal diamond growth base material according to claim 3, wherein a thickness of the single-crystal MgO layer is 0.1 to 100 μm.

8. The single-crystal diamond growth base material according to claim 4, wherein a thickness of the single-crystal MgO layer is 0.1 to 100 μm.

9. The single-crystal diamond growth base material according to claim 1, wherein any one of the iridium film, the rhodium film, and the platinum film is heteroepitaxially grown on the single-crystal MgO layer by a sputtering method.

10. The single-crystal diamond growth base material according to claim 1, wherein a thickness of any one of the iridium film, the rhodium film, and the platinum film is 5 Å to 100 μm.

11. The single-crystal diamond growth base material according to claim 2, wherein a thickness of any one of the iridium film, the rhodium film, and the platinum film is 5 Å to 100 μm.

12. The single-crystal diamond growth base material according to claim 3, wherein a thickness of any one of the iridium film, the rhodium film, and the platinum film is 5 Å to 100 μm.

13. The single-crystal diamond growth base material according to claim 4, wherein a thickness of any one of the iridium film, the rhodium film, and the platinum film is 5 Å to 100 μm.

14. The single-crystal diamond growth base material according to claim 5, wherein a thickness of any one of the iridium film, the rhodium film, and the platinum film is 5 Å to 100 μm.

15. The single-crystal diamond growth base material according to claim 6, wherein a thickness of any one of the iridium film, the rhodium film, and the platinum film is 5 Å to 100 μm.

16. The single-crystal diamond growth base material according to claim 7, wherein a thickness of any one of the iridium film, the rhodium film, and the platinum film is 5 Å to 100 μm.

17. The single-crystal diamond growth base material according to claim 8, wherein a thickness of any one of the iridium film, the rhodium film, and the platinum film is 5 Å to 100 μm.

18. The single-crystal diamond growth base material according to claim 9, wherein a thickness of any one of the iridium film, the rhodium film, and the platinum film is 5 Å to 100 μm.

19. The single-crystal diamond growth base material according to claim 1, wherein a surface of any one of the iridium film, the rhodium film, and the platinum film is subjected to a bias treatment.

20. A method for manufacturing a single-crystal diamond substrate, comprising at least:
- a step of preparing a base substrate that consists of a material having a linear expansion coefficient smaller than that of MgO and not smaller than $0.5 \times 10^{-6}$/K;
- a step of bonding a single-crystal MgO substrate having a thickness of 200 to 1000 μm to the prepared base substrate through a bonding layer obtained by forming on a bonding interface a film of an element or compound selected from the group consisting of gold (Au), platinum (Pt), titanium (Ti), chromium (Cr), iridium (Ir), rhodium (Rh), silicon (Si), and silicon oxide ($SiO_2$), or a laminated film formed of these films, the bonding layer having a thickness of 0.001 to 1000 μm, and thinning the single-crystal MgO substrate by mechanical polishing to obtain a single-crystal MgO layer;
- a step of heteroepitaxially growing a film constituted of any one of an iridium film, a rhodium film, and a platinum film on the bonded single-crystal MgO layer;
- a step of heteroepitaxially growing single-crystal diamond on the heteroepitaxially grown film; and
- a step of separating the heteroepitaxially grown single-crystal diamond to obtain a single-crystal diamond substrate.

21. The method for manufacturing a single-crystal diamond substrate according to claim 20, wherein a substrate consisting of any one of $Al_2O_3$, SiC, AlN, Si, $Si_3N_4$, diamond, and $SiO_2$ is prepared as the base substrate to be prepared.

22. The method for manufacturing a single-crystal diamond substrate according to claim 20, wherein a bias treatment is carried out with respect to a surface on which the single-crystal diamond is heteroepitaxially grown before the step of heteroepitaxially growing the single-crystal diamond.

23. The method for manufacturing a single-crystal diamond substrate according to claim 20, wherein the single-crystal diamond is heteroepitaxially grown by a microwave CVD method or a direct-current plasma CVD method at the step of heteroepitaxially growing the single-crystal diamond.

* * * * *